(12) United States Patent
Chung et al.

(10) Patent No.: US 11,390,520 B2
(45) Date of Patent: Jul. 19, 2022

(54) SYSTEMS AND METHODS FOR UNIFORM TARGET EROSION MAGNETIC ASSEMBLIES

(71) Applicant: Taiwan Semiconductor Manufacturing Co., Ltd., Hsin-Chu (TW)

(72) Inventors: Chen-Fang Chung, Zhubei (TW); Wen-Cheng Cheng, Hsinchu (TW); Tsez-Chong Tsai, Hsinchu (TW); Shuen-Liang Tseng, Hsinchu (TW); Szu-Hsien Lo, Hinchu (TW); Po-Wen Yang, Hsinchu (TW); Ming-Jie He, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 503 days.

(21) Appl. No.: 15/990,331

(22) Filed: May 25, 2018

(65) Prior Publication Data

US 2019/0035611 A1  Jan. 31, 2019

Related U.S. Application Data

(60) Provisional application No. 62/539,002, filed on Jul. 31, 2017.

(51) Int. Cl.
*H01J 37/34* (2006.01)
*B81C 1/00* (2006.01)
(Continued)

(52) U.S. Cl.
CPC .......... *B81C 1/0092* (2013.01); *B81B 3/0005* (2013.01); *B81C 1/0096* (2013.01);
(Continued)

(58) Field of Classification Search
CPC ... C23C 14/35; H01J 37/3408; H01J 37/3461; H01J 37/347
(Continued)

(56) References Cited

U.S. PATENT DOCUMENTS 6,299,740 B1 * 10/2001 Hieronymi .......... C23C 14/3407
204/192.12
7,767,064 B2 * 8/2010 Pavloff ............... H01J 37/3408
204/192.12
(Continued)

FOREIGN PATENT DOCUMENTS

CN   106958011 A * 7/2017
JP   2011026624 A * 2/2011 ........ H01J 37/32091

OTHER PUBLICATIONS

Translation to Watanabe (JP 2011-26624) Feb. 2011.*
Translation to Zhao (CN 106958011) published Jul. 2017.*

*Primary Examiner* — John J Brayton
(74) *Attorney, Agent, or Firm* — Duane Morris LLP

(57) ABSTRACT

In an embodiment, a system includes: a chamber; and a magnetic assembly contained within the chamber. The magnetic assembly comprises: an inner magnetic portion comprising first magnets; and an outer magnetic portion comprising second magnets. At least two adjacent magnets, of either the first magnets or the second magnets, have different vertical displacements, and the magnetic assembly is configured to rotate around an axis to generate an electromagnetic field that moves ions toward a target region within the chamber.

20 Claims, 10 Drawing Sheets

(51) Int. Cl.
  H01L 21/02  (2006.01)
  B81B 3/00  (2006.01)
(52) U.S. Cl.
  CPC ...... B81C 1/00349 (2013.01); B81C 1/00357 (2013.01); B81C 1/00373 (2013.01); B81C 1/00682 (2013.01); B81C 1/00912 (2013.01); B81C 1/00928 (2013.01); B81C 1/00992 (2013.01); H01J 37/3405 (2013.01); H01J 37/347 (2013.01); H01J 37/3414 (2013.01); H01J 37/3461 (2013.01); H01L 21/02499 (2013.01); H01L 21/02518 (2013.01); *B81B 2201/025* (2013.01); *B81B 2201/0235* (2013.01); *B81B 2201/0242* (2013.01); *B81B 2207/012* (2013.01); *B81C 2201/0133* (2013.01); *B81C 2201/112* (2013.01); *B81C 2203/0118* (2013.01); *B81C 2203/035* (2013.01)

(58) Field of Classification Search
  USPC .................................................. 204/298.19
  See application file for complete search history.

(56) References Cited

U.S. PATENT DOCUMENTS

| | | | |
|---|---|---|---|
| 2003/0052001 A1* | 3/2003 | Park | C23C 14/35 204/298.19 |
| 2009/0218218 A1* | 9/2009 | Kutsuzawa | H01J 37/3408 204/298.16 |
| 2011/0121927 A1* | 5/2011 | Iori | H01L 21/2855 335/306 |
| 2012/0027954 A1 | 2/2012 | Liu et al. | |
| 2013/0056347 A1 | 3/2013 | West et al. | |

* cited by examiner

SYSTEMS AND METHODS FOR UNIFORM TARGET EROSION MAGNETIC ASSEMBLIES

BACKGROUND

Physical vapor deposition (PVD) is a conventionally used process for deposition of materials atop a wafer (e.g., a substrate, semiconductor workpiece, or semiconductor device). A conventional PVD process illustratively includes bombarding a target comprising a source material with ions from a plasma of an inert gas having relatively heavy atoms (e.g., argon (Ar)) or a gas mixture comprising such inert gas. This bombardment may cause the source material to be sputtered from the target. The ejected source material may be accelerated towards the substrate via a negative voltage or bias formed on the wafer, resulting in a deposition of the source material atop the wafer. During the PVD process a magnetron may be rotated within a water filled cavity, near a backside of the target to facilitate sputtering.

Various improvements have been introduced to improve the process of PVD. Such improvements may relate to design of the target and the vacuum chamber. However, such means alone may not address the increasingly strict requirements for effective PVD. Therefore, conventional techniques of PVD are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
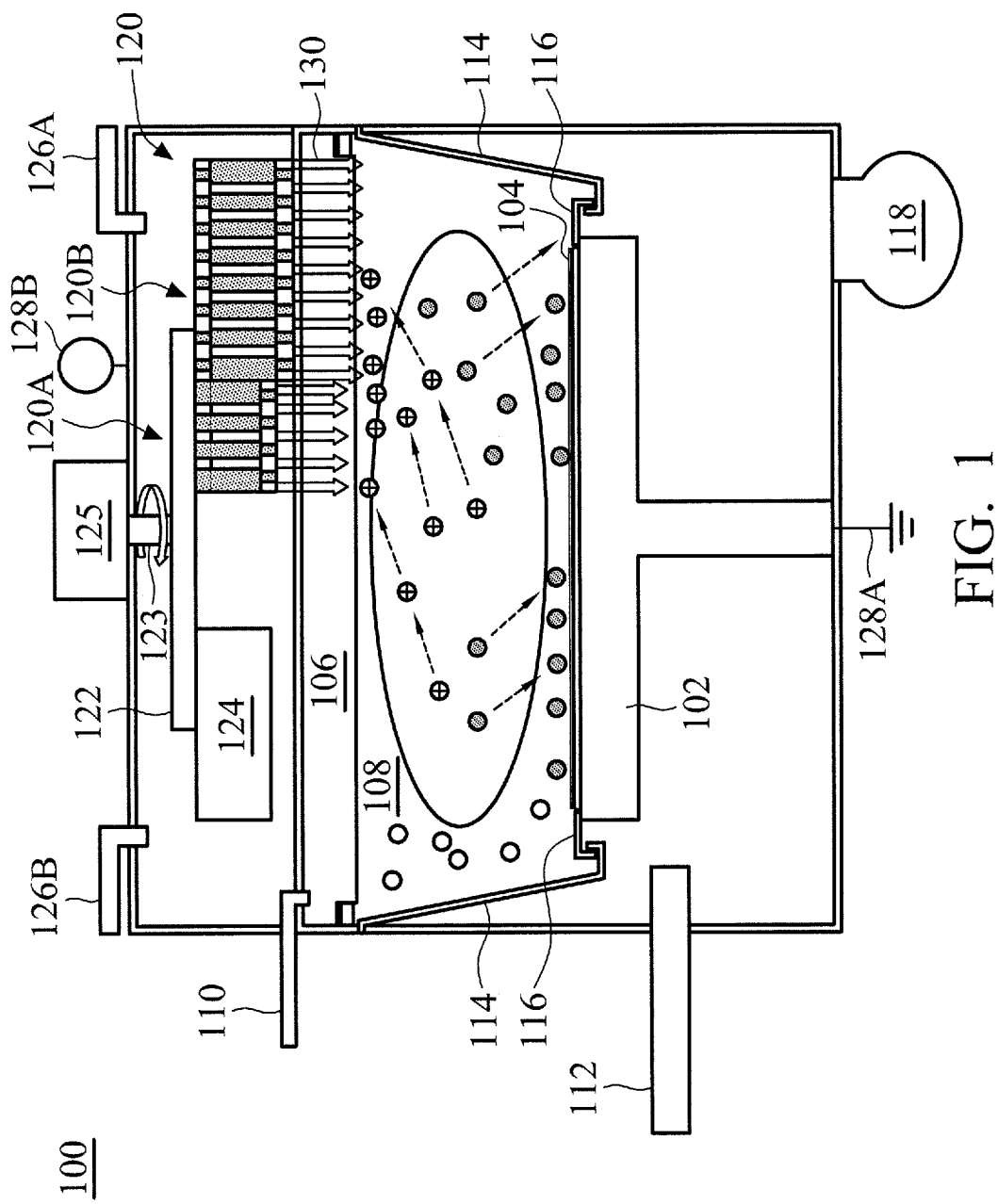
FIG. 1 is a cross sectional illustration of a physical vapor deposition (PVD) chamber, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative term's are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As introduced above, physical vapor deposition (PVD) chambers may include a spinning magnetron that may produce an electromagnetic field to sputter a target to release source material from the target for deposition on a wafer within the PVD chamber. Accordingly, the sputtering of a target also erodes the target, causing the target to lose source material.

Typical magnetrons include constituent magnets that are uniform and arrange such constituent magnets consistently, such as by being all vertically aligned. As will be discussed further below, this may be in contrast with a modular magnetic assembly in which the constituent magnets may not be consistent, such as by having some constituent magnets be vertically displaced. Such magnetrons may be rotated around an axis and create a uniform electromagnetic field with respect to an axis of rotation. However, design considerations for such electromagnetic fields typically do not take into consideration the unique features of different targets and PVD chambers. For example, different targets and different chambers may cause an electromagnetic field, which might be uniform in a vacuum (e.g., with a consistent electromagnetic field strength at a particular distance from the magnetron), to not be uniform within the chamber and thus sputter and erode a target in a non-uniform way. Also, different targets may be eroded in different ways and thus have different erosion profiles.

Targets may become unusable, or more difficult to use, when parts of a target become completely eroded even while other parts of the target are not completely eroded. For example, non-uniform target erosion may be characterized by a target which erodes faster at some points than others. These points may form depressions. An example of a depression may include dips, troughs, or valleys, along the surface of the target characterized by a localized low point surrounded by higher points along the surface. Another example of a depression may include a lower point along the surface of a target that surrounds a high point, or peak. With increased sputtering (e.g., due to greater magnetic field strength and/or use over a longer duration of time) the parts of the target with depressions may erode entirely through the target such that the target is devoid of material at and around the area that the depression forms. This area that becomes devoid of material may be referred to as a target puncture. Target punctures may render a target unusable or undesirable (e.g., due to reduced sputtering efficacy) such that the source material not yet sputtered is discarded and thus wasted. Target punctures may be caused by an uneven gradient of erosion over time at a target. An uneven gradient of erosion over time, or uneven erosion, may be characterized by a localized area of a target having a rate of erosion unmatched elsewhere to allow the vertical level of source material at the localized area to be even with other areas of the target.

Accordingly, the present disclosure provides various embodiments of modular magnetic assemblies that may be designed to produce an electromagnetic field or pattern that sputters a target to avoid target punctures. By avoiding target punctures, the target may be eroded along an even gradient (e.g., at a rate to avoid puncture) over time. These modular magnetic assemblies may replace traditional magnetrons which do not sputter a target in a manner that considers or avoids target punctures. The modular magnetic assembly may include different portions that each include a plurality of magnets. Based on an understanding of an erosion profile of a particular target (e.g., target erosion profile) in the context of a particular PVD chamber, a modular magnetic assembly may be designed that produces an electromagnetic field that sputters the target for even target erosion in the particular PVD chamber. Stated another way, an initial target erosion profile for a target may be determined and then modified (e.g., by modifying a modular magnetic assembly) to produce a target erosion profile for the target with erosion that avoids target punctures.

A target erosion profile may be indicative of how an electromagnetic field facilitates sputtering of a target. For example, depressions or a target puncture may indicate regions along the target where the electromagnetic field is stronger than other regions. Accordingly, an electromagnetic field at the regions with known depressions or target puncture, for a particular target and/or PVD chamber, may be reduced to be even with other regions of the electromagnetic field. Alternatively, an electromagnetic field at the regions without known depressions or target punctures, for a particular target and/or PVD chamber, may be increased to be even with other regions of the electromagnetic field.

In certain embodiments, the target erosion profile may be determined using a sensor to collect sensor data that may characterize electromagnetic fields within the PVD chamber, magnetic flux through a target, target depressions, target punctures, and the like. For example, a measuring instrument sensor may be utilized to measure the electromagnetic field for a given magnetron (e.g., unmodified magnetic assembly), target, and PVD chamber. Also, the same or different measuring instrument sensor may be utilized to measure physical contours on the target over time to confirm specific target depressions and/or target punctures for the given magnetron, target, and PVD chamber. Accordingly, the relationship between the electromagnetic field and target depressions and/or target punctures may be utilized to characterize a target erosion profile for a specific target, magnetron, and PVD chamber.

Based on the determined target erosion profile, a modular magnetic assembly may be designed to achieve more uniform or even target erosion to avoid target punctures. For example, based on the detected target erosion profile, modifications for the unmodified magnetic assembly (e.g., magnetron used to determine the target erosion profile) may be modeled to determine modifications that may produce a modular magnetic assembly with an electromagnetic field that erodes a target evenly (e.g., erodes a target along an even gradient over time) via sputtering to avoid target punctures. Specifically, this modeling may be performed by comparing how different modifications of the unmodified magnetic assembly may affect the target erosion profile. For example, this modeling may determine whether calibration as an increase and/or decrease in electromagnetic field strength at particular areas would affect the previously determined target erosion profile. These increases and/or decreases in electromagnetic field strength may be equated to modifications of the constituent magnets of the modular magnetic assembly. In certain embodiments, this modeling may be executed in an automated fashion utilizing conventional computer modeling. In other embodiments, this modeling may be executed manually by manually modifying at least one constituent magnet and then utilizing sensors to reassess a resultant electromagnetic field and physical contours on the target over time. Based on the modeling, a particular configuration of the modular magnetic assembly may be determined to achieve even erosion of the target during sputtering over time to avoid target punctures.

This calibration of the strength of the electromagnetic field produced by the modular magnetic assembly may be performed by modifying the constituent magnets of the modular magnetic assembly. For example, the strength of an electromagnetic field produced by the magnetic assembly at a particular region of the target may be calibrated by vertically displacing different magnets closer or further away from a target when the magnetic assembly is used for sputtering. As another example, the strength of an electromagnetic field produced by the magnetic assembly at a particular region of the target may be calibrated by other techniques, such as by changing a constituent magnet to include different materials that are more or less magnetic, changing a size of a constituent magnet, changing a location of a constituent magnet, designing different configurations of constituent magnets, moving an axis of rotation of a magnetic assembly, modifying a number of constituent magnets, changing a number and/or orientation of magnetic portions (e.g., poles), and the like.

FIG. 1 is a cross sectional illustration of a physical vapor deposition (PVD) chamber 100, in accordance with some embodiments. The chamber 100 may be any suitable PVD chamber configured for direct current (DC), and optionally radio frequency (RF), power. In some embodiments, the chamber 100 may be configured for both DC and RF power application, as discussed below. For example, the chamber 100 may include a heater or electrostatic chuck 102 on which a wafer 104 may be disposed thereon. An electrode may be disposed in the electrostatic chuck 102 for providing RF power to the process chamber 108. The RF power may be supplied to the electrode via an RF power supply. The RF power supply may be coupled to the electrode via a match network (not shown). Alternatively or in combination, the RF power supply (or another RF power supply) may be coupled to a target 106 disposed above the electrostatic chuck 102 (or to an electrode disposed proximate a backside of the target), for example, in a ceiling of the process chamber 108 of the PVD chamber 100.

The target 106 may comprise source material that is any suitable metal and/or metal alloy for use in depositing a layer on the wafer 104. For example, in some embodiments, the target 106 may comprise tungsten (W), copper (Cu), tantalum (Ta), silicon (Si), tantalum nitride (Ta(N)), titanium (Ti), aluminum copper (Al Cu) alloy, copper aluminum (Cu Al) alloy, and titanium aluminum (Ti Al) alloy. In particular embodiments, the target 106 may include combinations of the above referenced source materials. In certain embodiments, the target 106 may be configured to occupy a specific region of the chamber 100 referred to as a target region. The target region may be fully occupied by (e.g., coextensive with) the target 106 when the target 106 is disposed within the target region.

A DC power supply 110 may be coupled to the target 106 to provide a bias voltage on the target 106 to direct a plasma formed in the process chamber 108 towards the target 106. The plasma may be formed from a process gas, such as argon (Ar) or the like, provided to the process chamber 108 by a gas source 112. Although illustrated as outside of shields 114 and cover ring 116 within the process chamber that contains the plasma reaction, the gas source may be directly connected to a region within the shield 114 and cover ring 116 in other embodiments. A vacuum pump 118 may assist in regulation of the gaseous environment of the process chamber 108.

A modular magnetic assembly 120 may be attached to a pedestal 122 with a shaft 123 for rotating the modular magnetic assembly 120. The pedestal 122 may also be attached with a counterweight 124 to the modular magnetic assembly 120. The modular magnetic assembly 120 may be disposed above the target 106. A liquid cooling inlet 126A and a liquid cooling outlet 126B may provide cooling liquid for the modular magnetic assembly 120 during operation of the modular magnetic assembly 120. Also, the PVD chamber 100 may include an anode 128A and a cathode 128B. The modular magnetic assembly 120 may, for example, facilitate uniform sputtering of metal atoms from the target 106, and/or deposition of a layer of metal atoms on the wafer 104. As will be discussed further below, the modular magnetic assembly 120 may be designed to produce an electromagnetic field that uniformly sputters the target 106 without target puncture, or with reduced occurrence of target punctures. For example, the modular magnetic assembly 120 may have four constituent magnets 120A that are vertically displaced (e.g., with bottoms higher than) the other eight constituent magnets 120B. According, the electromagnetic field produced by the four constituent magnets 120A may be weaker at the target than the electromagnetic field produced by the eight constituent magnets 120B. However, the combined electromagnetic field may be more evenly applied at the target than if no constituent magnets are vertically displaced (e.g., if all constituent magnets are vertically uniform) due to, for example, the unique interaction of the modular magnetic assembly 120 with the particular target 106 and the particular process chamber 108.

In operation, a gas, such as argon (Ar) or the like is provided to the process chamber 108 from the gas source 112. The gas may be provided at a sufficient pressure, such that at least a portion of the gas includes ionized species, such as Ar ions. The ionized species are directed to the target 106 by a DC voltage applied to the target 106 by the DC power supply 110. The ionized species collide with the target 106 to eject metal atoms from the target 106. The metal atoms, for example, having a neutral charge, fall towards the wafer 104 and deposit on the wafer's surface. Concurrently, with the collision of the ionic species with the target 106 and the subsequent ejection of metal atoms, the modular magnetic assembly 120 is rotated above the target 106 about the shaft 123 using a motor 125. The modular magnetic assembly 120 produces a magnetic field, referred to in operation as an electromagnetic field 130, within the chamber 100, generally close to the surface of the target 106 to trap electrons which can collide with and ionize of any gas molecules proximate the target 106, which in turn increases the local ion species density proximate the surface of the target 106 and increases the sputtering rate.

Figure 2A:
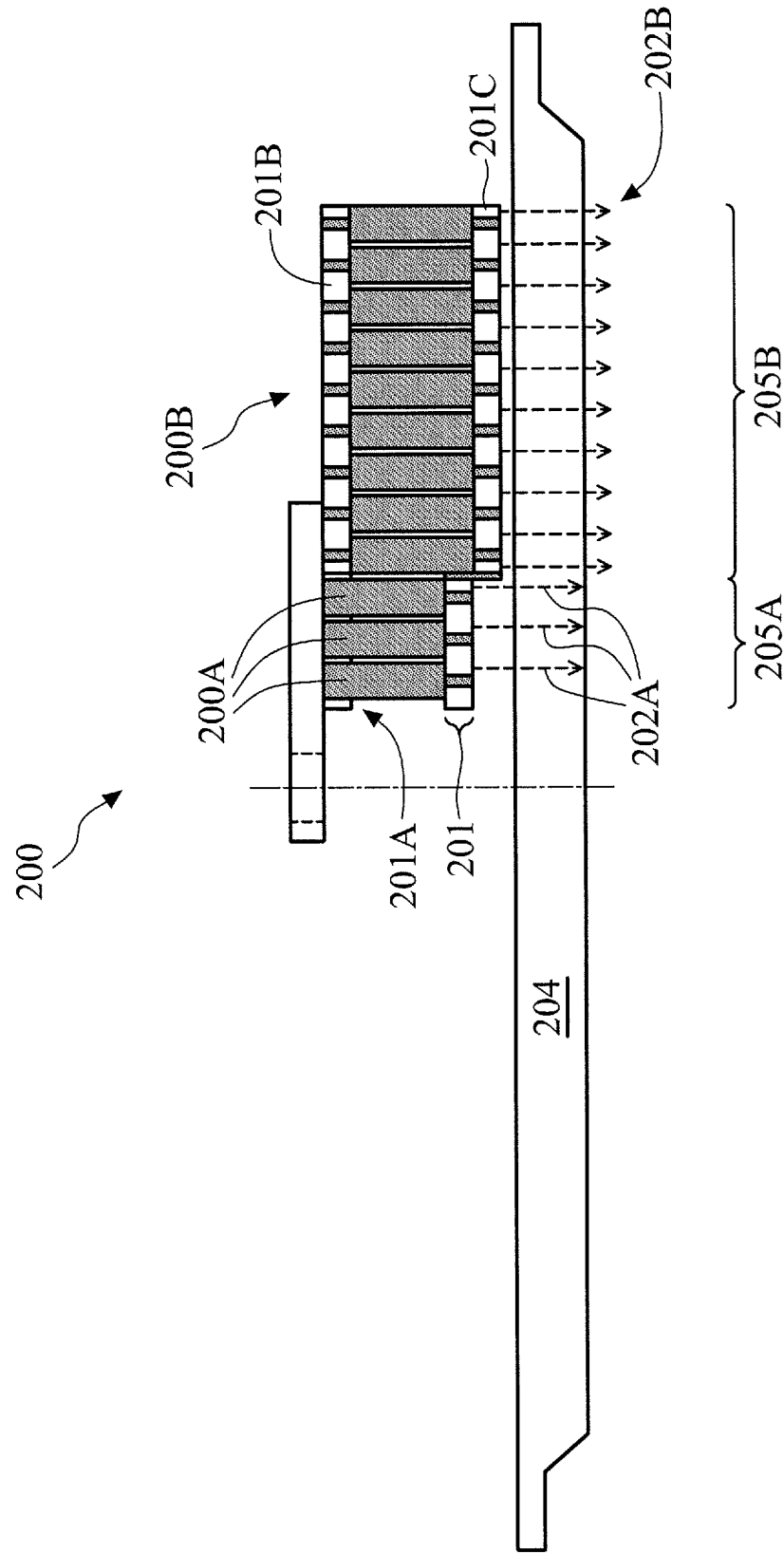
FIG. 2A is a cross sectional illustration of a modular magnetic assembly with vertical displacement, in accordance with some embodiments.

FIG. 2A is a cross sectional illustration of the modular magnetic assembly 200 with vertical displacement, in accordance with some embodiments. The modular magnetic assembly may include three constituent magnets 200A that are vertically displaced (e.g., with bottoms higher than) the other nine constituent magnets 200B. By being vertically displaced, the three constituent magnets 200A may have a bottom at a vertical displacement 201 from the other nine constituent magnets 200B. In certain embodiments, the three constituent magnets 200A may be partially inserted within bore holes 201A within the shunt plate 201B that surround the top part of the three constituent magnets 200A in order to achieve the vertical displacement 201 while having each of the constituent magnets be of the same length. The constituent magnets may be connected by a lower plate 201C opposite the shunt plate 201B on the lower part of the constituent magnets. The lower plate 201C may be continuous but also include a vertical displacement of the same magnitude and corresponding area as the vertical displacement 201 discussed above.

Accordingly, the electromagnetic field 202A produced by the three constituent magnets 200A may be weaker at the target 204 than the electromagnetic field produced by the nine constituent magnets 200B. However, the combined electromagnetic field may sputter the target to produce more even erosion that avoids target puncture than if no constituent magnets are vertically displaced (e.g., if all constituent magnets are vertically uniform). This may be due to, for example, the unique interaction of the modular magnetic assembly 200 with the particular target 204.

For example, in certain embodiments, a target may be more susceptible to target puncture at particular regions. This may be due to reasons such as material differences (e.g., where different materials of a target may have different susceptibility to erosion) or different quantities of materials along different parts of a target (e.g., where a target may be thicker in some parts than others). As a more specific example, the first region 205A of the target 204 may be more susceptible to target puncture than the second region 205B of the target 204. Accordingly, to avoid target puncture by applying a uniform electromagnetic field along the entire surface of the target 204, which would disregard different susceptibilities to puncture at different target areas, the three constituent magnets 200A may be designed (e.g., to have the vertical displacement 201) such that the associated electromagnetic field 202A is weaker at the target 204 along the first region 205A than the second region 205B.

Figure 2B:
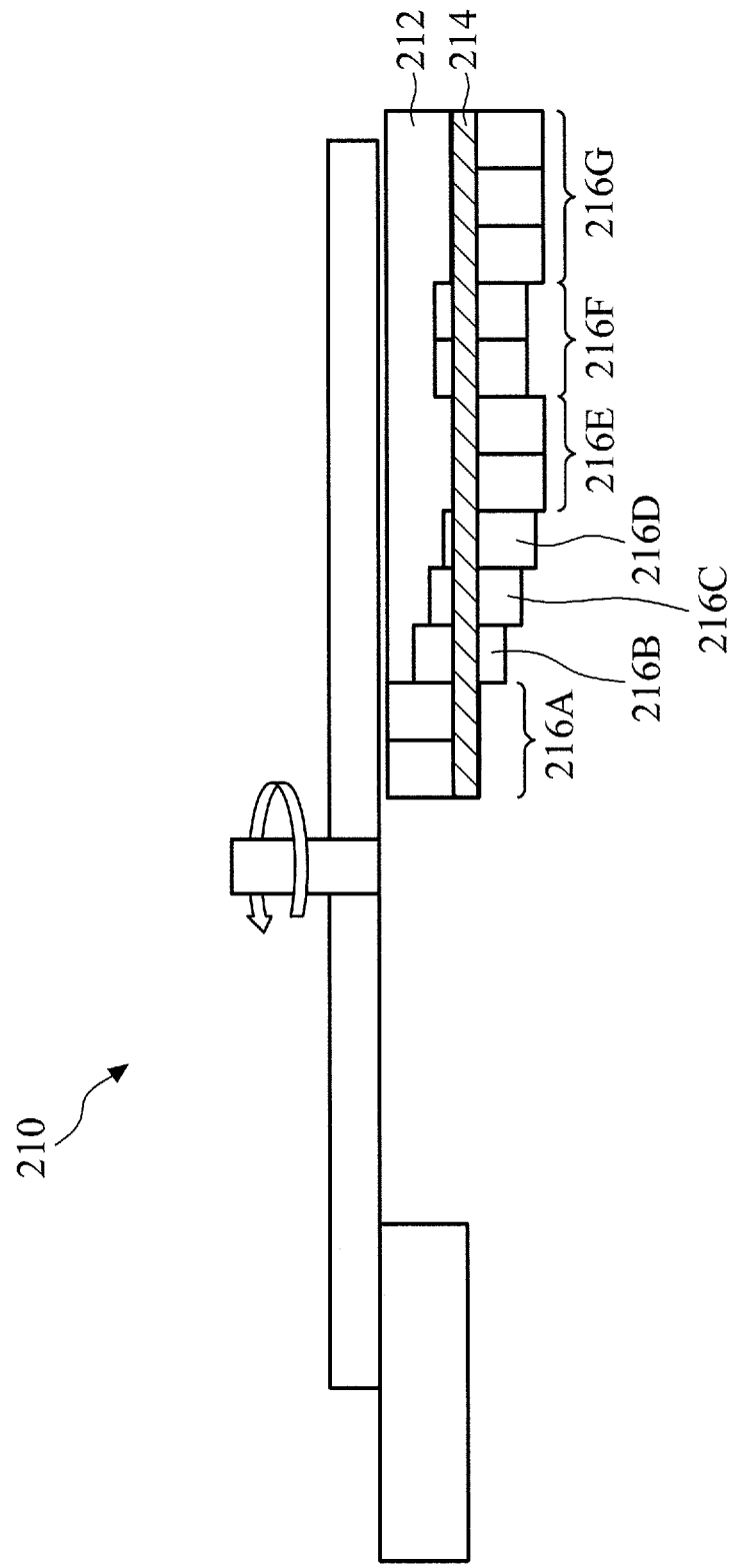
FIG. 2B is a cross sectional illustration of a modular magnetic assembly with multiple vertical displacement, in accordance with some embodiments.

FIG. 2B is a cross sectional illustration of a magnetic assembly 210 with multiple vertical displacement, in accordance with some embodiments. The magnetic assembly 210 may include a shunt plate 212 along the top of each of the constituent magnets of the magnetic assembly 210. Also, an intermediate brace 214 may provide additional support across each of the constituent magnets of the magnetic assembly 200. The intermediate brace 214 may be a brace that connects an exterior portion of the constituent magnets of the magnetic assembly 200.

Furthermore, the magnetic assembly 210 may have multiple vertical displacements. For example, a first set of the constituent magnets 216A may be vertically displaced higher than a second set of the constituent magnets 216B. The second set of the constituent magnets 216B may be vertically displaced higher than a third set of the constituent magnets 216C. The third set of the constituent magnets 216C may be vertically displaced higher than a fourth set of the constituent magnets 216D. The fourth set of the constituent magnets 216D may be vertically displaced higher than a fifth set of the constituent magnets 216E. The fifth set of the constituent magnets may be vertically displaced lower than a sixth set of the constituent magnets 216F. The sixth set of the constituent magnets 216F may be vertically displaced higher than a seventh set of the constituent magnets 216G. Also, from the cross sectional view of FIG. 2B, the first, fifth, and sixth sets of the constituent magnets may include two magnets. Also, from the cross sectional view of FIG. 2B, the second, third and fourth sets of the constituent magnets may include a single magnet. Additionally, from the cross sectional view of FIG. 2B, the seventh set of the constituent magnets may include three magnets. Thus, various sets of the constituent magnets may include a different number of adjacent magnets and also be differently vertically displaced. In certain embodiments, the amount of vertical displacement may be the same while in other embodiments the amount of vertical displacement may vary among different constituent magnets of the magnetic assembly.

Figure 2C:
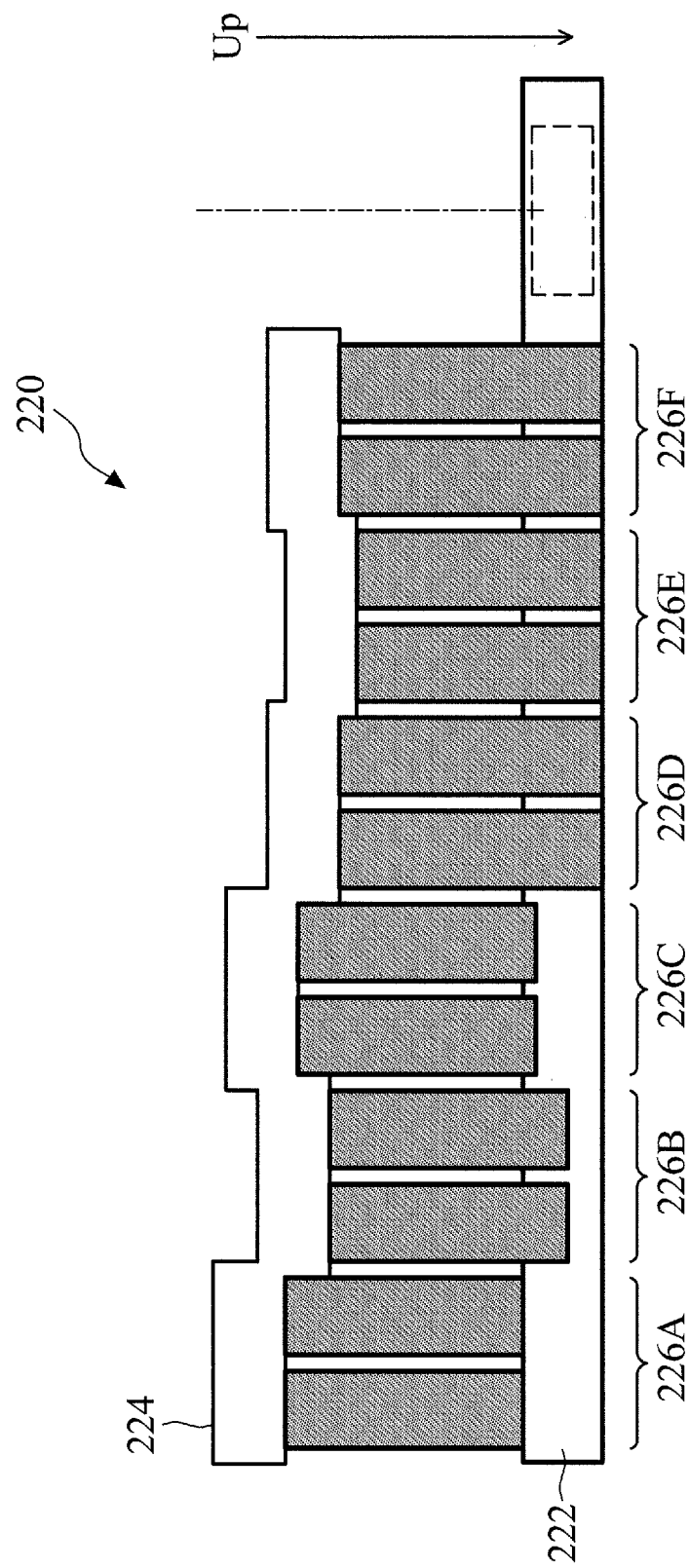
FIG. 2C is a cross sectional illustration of a modular magnetic assembly with multiple vertical displacement braced at vertical extremities, in accordance with some embodiments.

FIG. 2C is a reverse cross sectional illustration of a magnetic assembly 220 with multiple vertical displacements and braced at vertical extremities (e.g., top or bottom), in accordance with some embodiments. FIG. 2C is a reverse cross sectional view in that up and down are flipped, such that the upper extremities of the constituent magnets abuts a shunt plate 222 while the lower extremities of the constituent magnets abut a lower plate 224. Also, from a side view, a first set of the constituent magnets 226A may be vertically displaced lower than a second set of the constituent magnets 226B. The second set of the constituent magnets 226B may be vertically displaced higher than a third set of the constituent magnets 226C. The third set of the constituent magnets 226C may be vertically displaced lower than a fourth set of the constituent magnets 226D. The fourth set of the constituent magnets 226D may be vertically displaced lower than a fifth set of the constituent magnets 226E. The fifth set of the constituent magnets may be vertically displaced higher than a sixth set of the constituent magnets 226F. Also, the amount of displacements may be different among different sets of the constituent magnets. For example, the displacement between the fifth set of the constituent magnets 226E and either the sixth set of the constituent magnets 226F and the fourth set of the constituent magnets 226D may be less than the displacement between the first set of the constituent magnets 226A and the second set of the constituent magnets 226B.

Figure 2D:
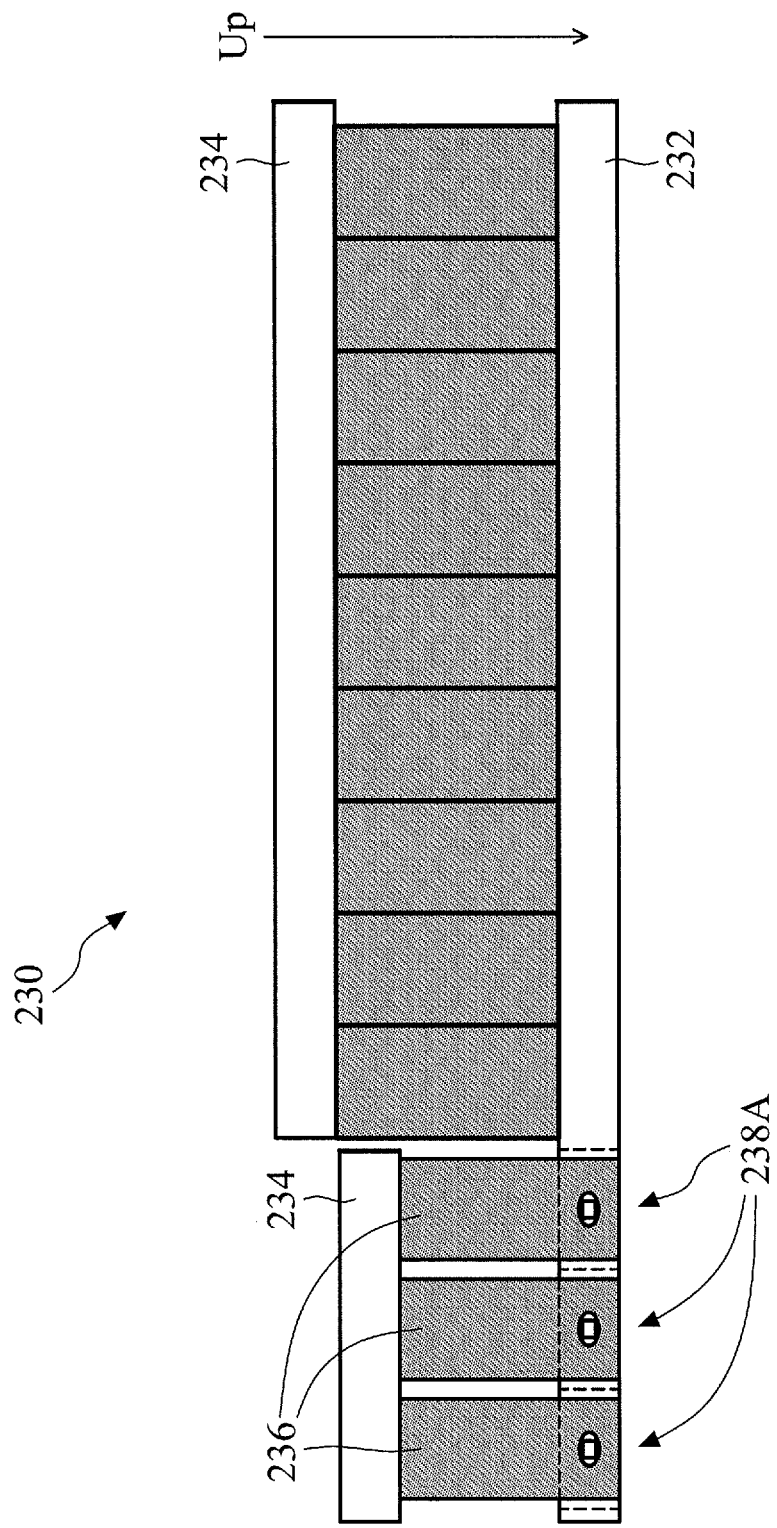
FIG. 2D is a cross sectional illustration of a magnetic assembly with vertical displacement and a discontinuous brace at a vertical extremity, in accordance with some embodiments.

FIG. 2D is a reverse cross sectional illustration of a magnetic assembly 230 with vertical displacement and a discontinuous brace at a vertical extremity, in accordance with some embodiments. FIG. 2D is a reverse cross sectional view in that up and down are flipped, such that the upper extremities of the constituent magnets abuts a shunt plate 232 while the lower extremities of the constituent magnets abut a lower plate 234.

The modular magnetic assembly 230 may include three constituent magnets 236 that are vertically displaced relative to (e.g., with bottoms higher than) the other nine constituent magnets. In certain embodiments, the three constituent magnets 236 may be partially inserted within bore holes 238A within the shunt plate 232 that surround the top part of the three constituent magnets 236 in order to achieve vertical displacement while having each of the constituent magnets of the modular magnetic assembly 230 be of the same length. The lower plate 234 may be discontinuous such that the lower plate 234 that abuts the three constituent magnets 236 is discontinuous (e.g., does not abut) the lower plate 234 that abuts the other nine constituent magnets.

Figure 2E:
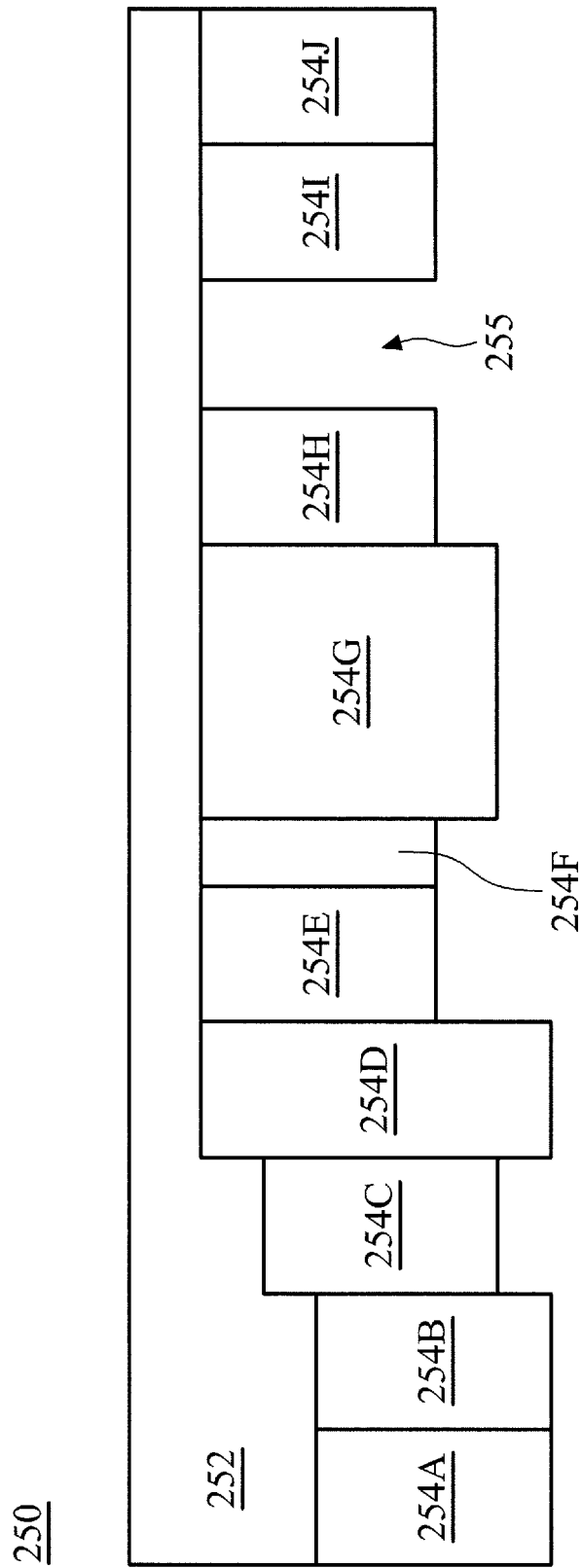
FIG. 2E is a cross sectional illustration of a magnetic assembly with different vertical and horizontal displacements, in accordance with some embodiments.

FIG. 2E is a cross sectional illustration of a magnetic assembly 250 with different vertical and horizontal displacements, in accordance with some embodiments. The magnetic assembly 250 may include a shunt plate that abuts the upper extremities of the constituent magnets, without a lower plate at the lower extremities of the constituent magnets.

From a side view, the magnetic assembly may be constituted by a first magnet 254A, a second magnet 254B, a third magnet 254C, a fourth magnet 254D, a fifth magnet 254E, a sixth magnet 254F, a seventh magnet 254G, an eighth magnet 254H, a ninth magnet 254I, and a tenth magnet 254J. These different magnets may have different properties. For example, the fourth magnet 254D may be longer than other magnets (e.g., the first magnet 254A). Also, the sixth magnet 254F may be narrower than other magnets (e.g., the first magnet 254A). The seventh magnet 254G may be wider than other magnets (e.g., the first magnet 254A). Also, the eighth magnet 254H may be separated by a space 255 (e.g., be spaced by a distance) from the ninth magnet 254I. The space 255 may be greater than a separation between other magnets (e.g., between the first magnet 254A and the second magnet 254B).

Figure 2F:
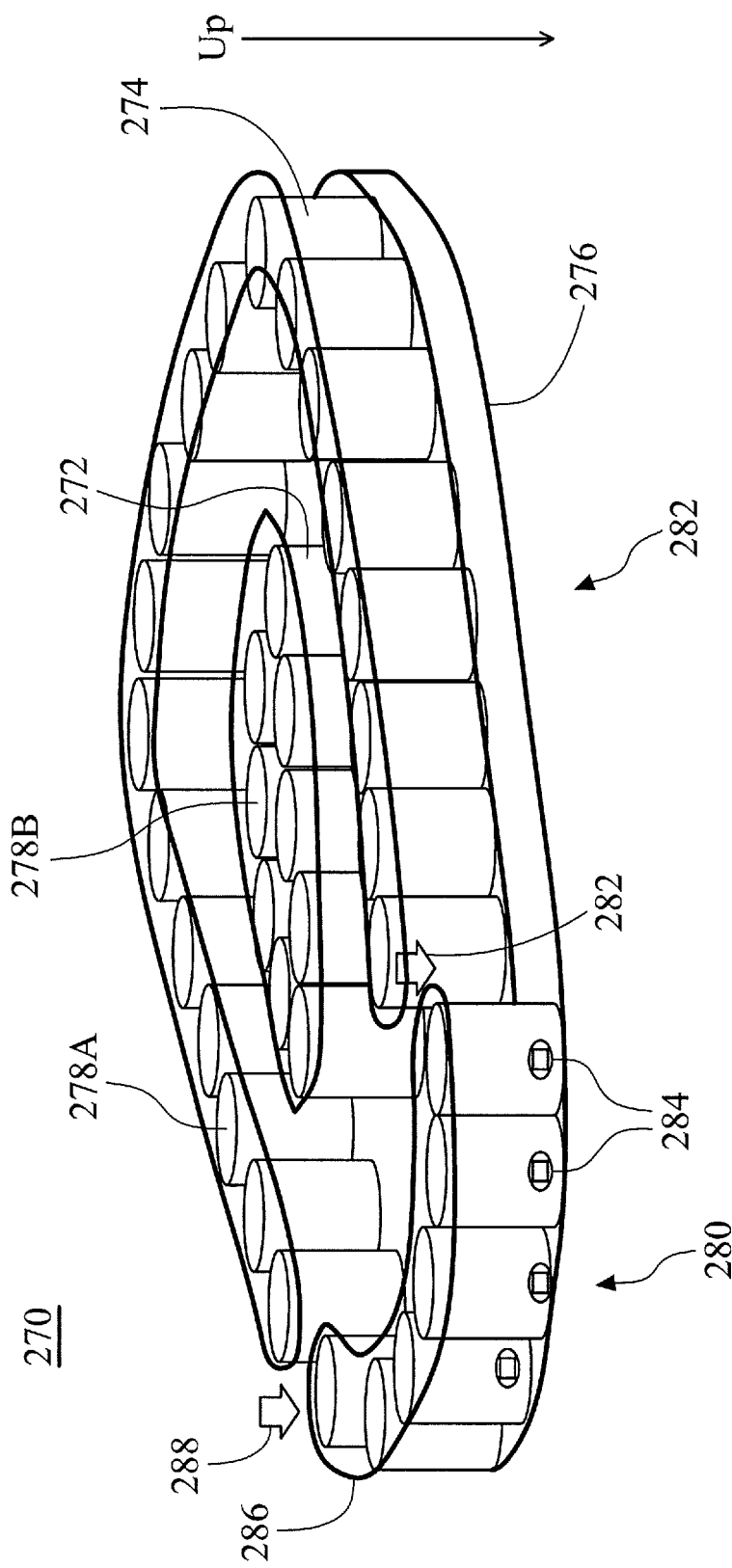
FIG. 2F is a perspective illustration of a magnetic assembly with vertical displacement, in accordance with some embodiments.

FIG. 2F is a bottom perspective illustration of a magnetic assembly 270 with vertical displacement, in accordance with some embodiments. As illustrated, the constituent magnets may be organized in multiple magnetic portions, which may function as poles when producing an electromagnetic field. For example, the inner magnetic portion 272 may be surrounded, radially, by an outer magnetic portion 274. The pair of magnetic portions may form a closed loop magnetic field. As used herein, a closed loop magnetic field refers to a pole having no discrete beginning and end, but instead forms a loop. The polarity within a given pole is the same (e.g., north or south), but the polarity between each pole is opposite each other (e.g., inner north and outer south or inner south and outer north).

Also, the inner magnetic portion 272 and the outer magnetic portion 274 may be connected via a shunt plate 276 along a top of the constituent magnets. A bottom of the constituent magnets may be connected using a bottom inner plate 278A for the inner magnetic portion 272 and a bottom outer plate 278B for the outer magnetic portion 274. The plates and/or the shunt plate may be fabricated from a ferromagnetic material, such as in a non-limiting example, 400-series stainless steel or other suitable materials.

A part of the outer magnetic portion 274 may be vertically displaced from other parts of the outer magnetic portion 274. For example, an upward vertically displaced part 280 of the outer magnetic portion 274 may be vertically displaced upward relative to the other parts 282 of the outer magnetic portion. In being upward vertically displaced, the constituent magnets of the upward vertically displaced part 280 of the outer magnetic portion 274 may be of a same size and shape as other constituent magnets, but vertically displaced into bore holes of the shunt plate 276. To further secure the constituent magnets, a pin 284 may be inserted through constituent magnets to secure the constituent magnets within the bore holes. Also, the bottom outer plate 286 that abuts the upward vertically displaced portion may also be upward vertically displaced via vertical displacement 288.

Figure 2G:
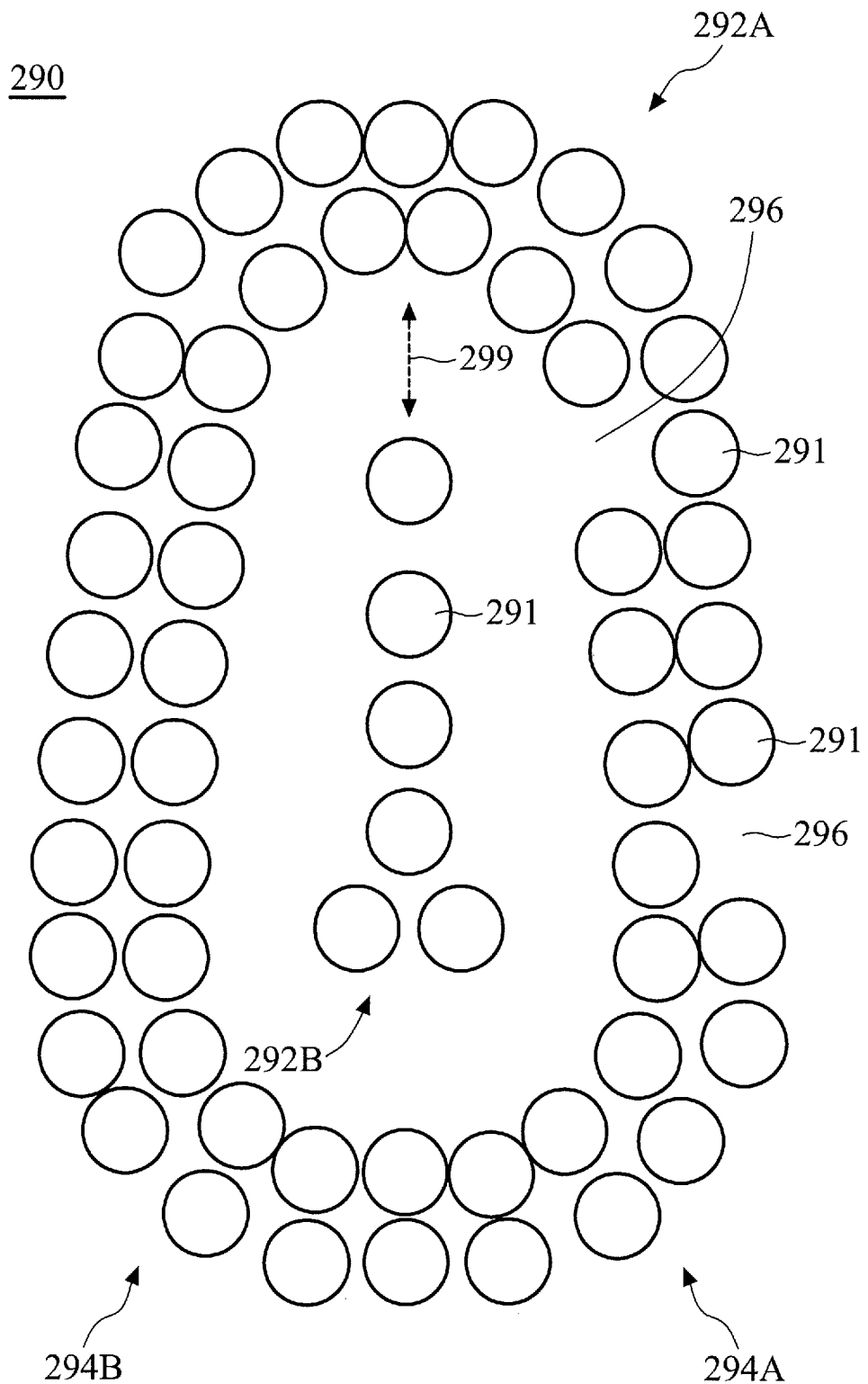
FIG. 2G is a partial bottom illustration of a magnetic assembly, in accordance with some embodiments.

FIG. 2G is a partial bottom illustration of a magnetic assembly 290, in accordance with some embodiments. As illustrated, the constituent magnets 291 may be organized in multiple magnetic portions, which may function as poles when producing an electromagnetic field. The magnets in each portion need not be completely uniformly distributed. For example, at least some magnets in the outer magnetic portion 292A (to contrast with an inner magnetic portion 292B) may be disposed in multiple rows and include gaps 296 on the right side 294A that are not mirrored on the left side 294B, where the left and right sides are divided along a middle axis 299.

Figure 3:
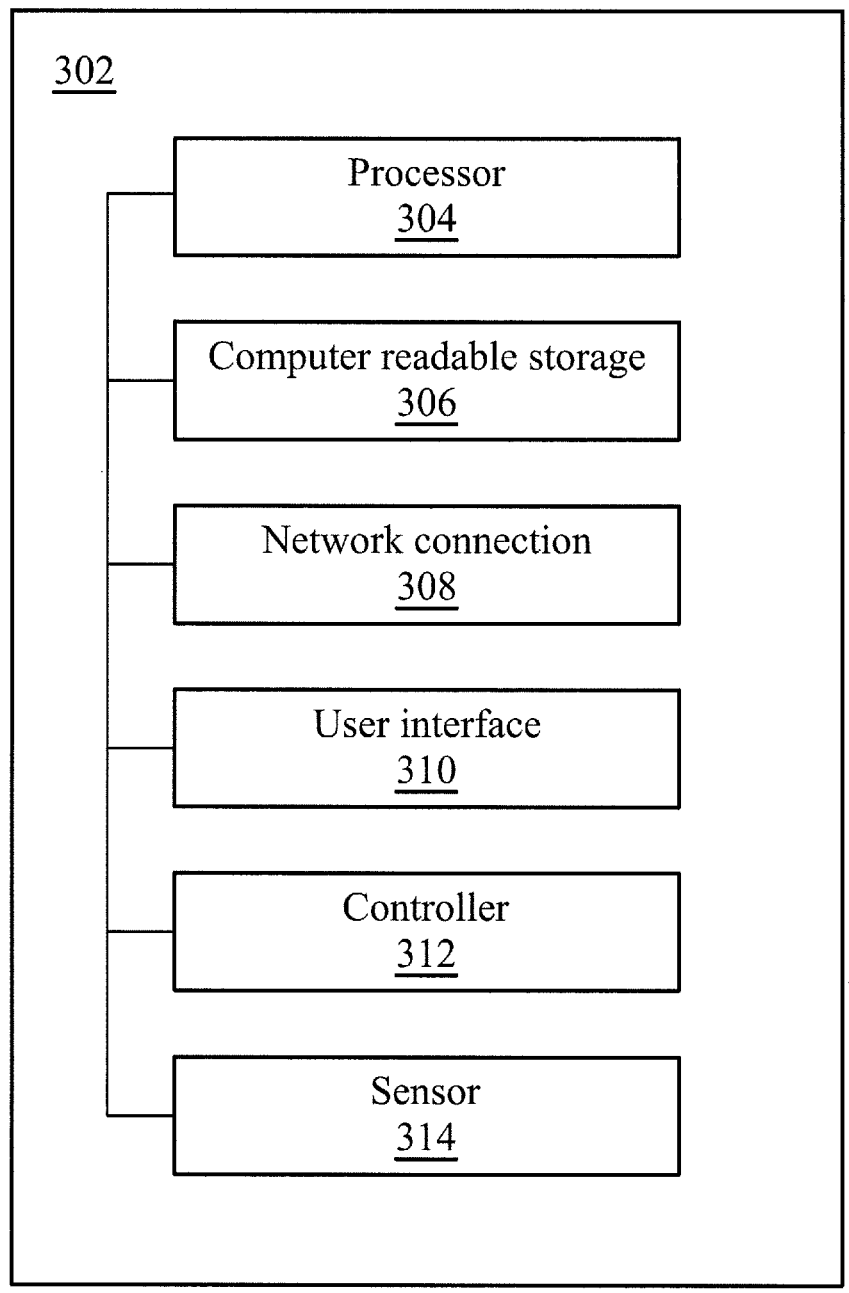
FIG. 3 is a block diagram of various functional modules of a modular magnetic assembly PVD system, in accordance with some embodiment.

FIG. 3 is a block diagram of various functional modules of a modular magnetic assembly PVD system 302, in accordance with some embodiment. The modular magnetic assembly PVD system 302 may be part of the PVD chamber that includes a modular magnetic assembly, as discussed above. The modular magnetic assembly PVD system 302 may include a processor 304. In further embodiments, the processor 304 may be implemented as one or more processors.

The processor 304 may be operatively connected to a computer readable storage module 306 (e.g., a memory and/or data store), a network connection module 308, a user interface module 310, a controller module 312, and a sensor module 314. In some embodiments, the computer readable storage module 306 may include modular magnetic assembly operation logic that may configure the processor 304 to perform the various processes discussed herein. The computer readable storage 306 may also store data, such as sensor data characterizing electromagnetic fields within the PVD chamber, magnetic flux through a target, identifiers for a wafer, identifiers for a PVD chamber, identifiers for a semiconductor workpiece fabrication process, identifiers for a target, target erosion profiles, and any other parameter or information that may be utilized to perform the various processes discussed herein.

The network connection module 308 may facilitate a network connection of the modular magnetic assembly PVD system 302 with various devices and/or components of the modular magnetic assembly PVD system 302 that may communicate (e.g., send signals, messages, instructions, or data) within or external to the modular magnetic assembly PVD system 302. In certain embodiments, the network connection module 308 may facilitate a physical connection, such as a line or a bus. In other embodiments, the network connection module 308 may facilitate a wireless connection, such as over a wireless local area network (WLAN) by using a transmitter, receiver, and/or transceiver. For example, the network connection module 308 may facilitate a wireless or wired connection with the processor 304 and the computer readable storage 306.

The modular magnetic assembly PVD system 302 may also include the user interface module 310. The user interface may include any type of interface for input and/or output to an operator of the modular magnetic assembly PVD system 302, including, but not limited to, a monitor, a laptop computer, a tablet, or a mobile device, etc.

The modular magnetic assembly PVD system 302 may include a controller module 312. The controller module 312 may be configured to control various physical apparatuses that control movement or functionality for a wafer, pedestal, electrostatic chuck, vacuum pump, rotational motor, chamber door, or any other controllable aspect of a PVD chamber. For example, the controller module 312 may be configured to control movement or functionality for at least one of a door of the chamber, a rotational motor that rotates a modular magnetic assembly around an axis of rotation, and the like. For example, the controller module 312 may control a motor or actuator. The controller may be controlled by the processor and may carry out the various aspects of the various processes discussed herein.

The sensor module 314 may represent a sensor configured to collect sensor data that may be utilized to characterize a target erosion profile. For example, the sensor may represent a sensor configured to characterize electromagnetic fields within the PVD chamber, magnetic flux through a target, target depressions, target punctures, and the like. In certain embodiments, the sensor 314 may be a magnetometer, electric field sensor, an electromagnetic field sensor, a profilometer, or other conventional measuring instrument.

Figure 4:
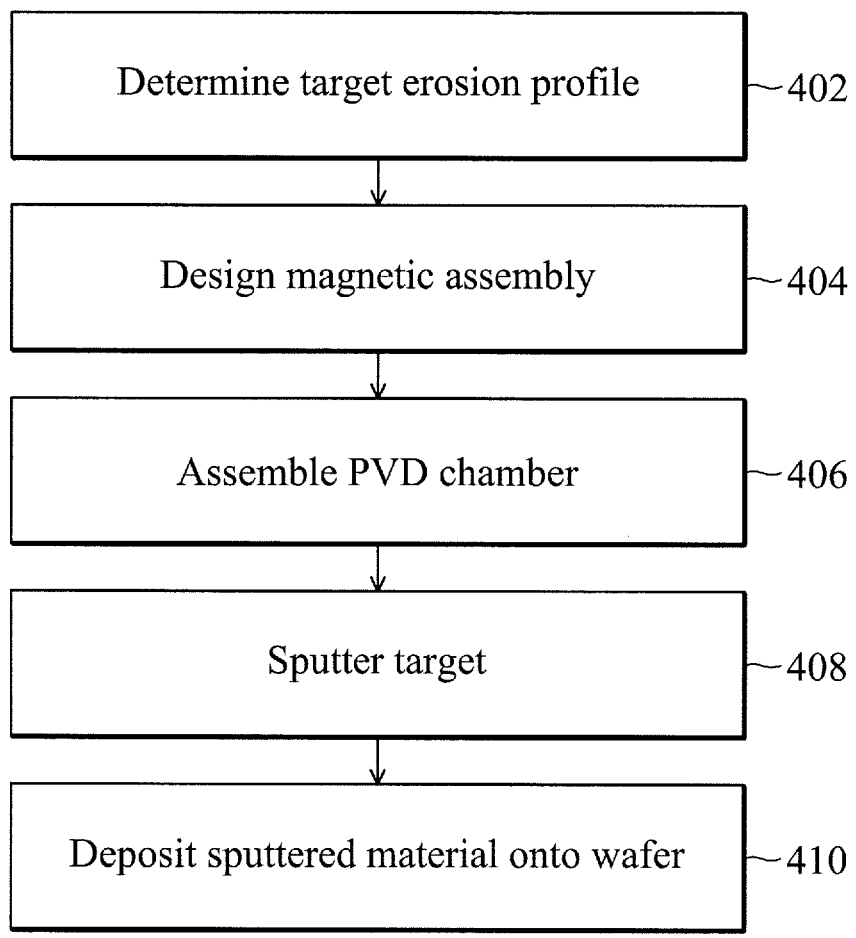
FIG. 4 is a flow chart of a modular magnetic assembly PVD process, in accordance with some embodiments.

FIG. 4 is a flow chart of a modular magnetic assembly PVD process 400, in accordance with some embodiments. The modular magnetic assembly PVD process may be performed by a modular magnetic assembly PVD system in conjunction with the various components of a PVD chamber (e.g., a modular magnetic assembly), as discussed above. It is noted that the process 400 is merely an example, and is not intended to limit the present disclosure. Accordingly, it is understood that additional operations may be provided before, during, and after the process 400 of FIG. 4, certain operations may be omitted, certain operations may be performed concurrently with other operations, and that some other operations may only be briefly described herein.

At operation 402, a target erosion profile may be determined. The target erosion profile may characterize electromagnetic interaction with a target within a PVD chamber indicative of target depressions and/or target punctures over time. The target erosion profile may be determined, for example, utilizing the sensor, processor, and computer readable storage discussed above. Specifically, a sensor may be configured to collect sensor data that may characterize electromagnetic fields within the PVD chamber, magnetic flux through a target, target depressions, target punctures, and the like. For example, a measuring instrument may be utilized to measure the electromagnetic field for a given magnetron (e.g., unmodified magnetic assembly), target, and PVD chamber. Also, the same or different measuring instrument may be utilized to measure physical contours on the target over time to confirm specific target depressions and/or target punctures for the given magnetron, target, and PVD chamber. Accordingly, the relationship between the electromagnetic field and target depressions and/or target punctures may be analyzed to determine a target erosion profile for a specific target, magnetron, and PVD chamber.

At operation 404, a modular magnetic assembly may be designed to achieve more uniform target erosion to avoid target punctures. For example, based on the detected target erosion profile, modifications for the unmodified magnetic assembly (e.g., magnetron) used to determine the original target erosion profile of operation 402 may be modeled. This modeling may be used determine modifications that may produce a modular magnetic assembly associated with an electromagnetic field that erodes a target evenly via sputtering to avoid target punctures. Specifically, this modeling may be performed by comparing how different modifications of the unmodified magnetic assembly may affect the associated target erosion profile. For example, this modeling may determine whether calibration as an increase and/or decrease in electromagnetic field strength at particular areas would affect a target erosion profile. These increases and/or decreases in electromagnetic field strength may be equated to modifications of the constituent magnets of the modular magnetic assembly. In certain embodiments, this modeling may be executed in an automated fashion utilizing conventional computer modeling. In other embodiments, this modeling may be executed manually by manually modifying at least one constituent magnet and then utilizing sensors to reassess a resultant electromagnetic field and physical contours on the target over time. Based on the modeling, a particular configuration of the modular magnetic assembly may be determined to achieve even erosion of the target during sputtering to avoid target punctures. Accordingly, an initial or original target erosion profile for a target may be determined and then modified (e.g., by modifying a modular magnetic assembly) to produce a target erosion profile for the target with erosion that avoids target punctures.

This calibration of the strength of the electromagnetic field produced by the modular magnetic assembly may be performed by modifying the constituent magnets of the modular magnetic assembly. For example, the strength of an electromagnetic field produced by the modular magnetic assembly at a particular region of the target may be calibrated by vertically displacing different magnets closer or further away from a target when the modular magnetic assembly is used for sputtering. As another example, the strength of an electromagnetic field produced by the magnetic assembly at a particular region of the target may be calibrated by other techniques, such as by changing a constituent magnet to include different materials that are more or less magnetic, changing a size of a constituent magnet, changing a location of a constituent magnet, designing different configurations of constituent magnets, moving an axis of rotation of a magnetic assembly, modifying a number of constituent magnets, changing a number and/or orientation of magnetic portions (e.g., poles), and the like.

At operation 406, a PVD chamber may be assembled with the modular magnetic assembly of operation 404 that avoids target punctures. The modular magnetic assembly may be assembled with constituent magnets modified as discussed above to avoid target punctures.

At operation 408, the target may be sputtered using the modular magnetic assembly. As discussed above, a gas, such as argon (Ar) or the like may be provided to a process chamber. The gas may be provided at a sufficient pressure, such that at least a portion of the gas includes ionized species, such as Ar ions. The ionized species may be directed to the target by a DC voltage applied to the target. The ionized species may collide with the target to eject metal atoms from the target. The modular magnetic assembly may produce an electromagnetic field to trap electrons which can collide with and ionize gas molecules proximate the target, which in turn increases the local ion species density proximate the surface of the target and increases the sputtering rate.

At operation 410, the sputtered target material may be deposited on a wafer within the PVD chamber. As discussed above, the sputtered metal atoms, may fall towards the wafer and deposit on the wafer's surface.

In an embodiment, a system includes: a chamber; and a magnetic assembly contained within the chamber. The magnetic assembly comprises: an inner magnetic portion comprising first magnets; and an outer magnetic portion comprising second magnets. At least two adjacent magnets, of either the first magnets or the second magnets, have different vertical displacements, and the magnetic assembly is configured to rotate around an axis to generate an electromagnetic field that moves ions toward a target region within the chamber.

In another embodiment, a magnetic assembly for use in physical vapor deposition includes: first magnets connected via an inner plate; and second magnets connected via an outer plate, wherein: the first magnets are connected with the second magnets via a shunt plate, at least two adjacent magnets, of either the first magnets or the second magnets, have different vertical displacements, and the magnetic assembly is configured to rotate around an axis to generate an electromagnetic field.

In another embodiment, a method includes: producing a magnetic field using a magnetic assembly contained with a chamber, the magnetic assembly including: first magnets, and second magnets, wherein at least two adjacent magnets, of either the first magnets or the second magnets, have different vertical displacements; and sputtering a target disposed within the chamber using an electromagnetic field of ions controlled by the magnetic field; and depositing a material sputtered from the target onto a wafer within the chamber.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
a chamber;
a magnetic assembly contained within the chamber, the magnetic assembly comprising:
a plurality of magnets each having a different vertical displacement from another one of the plurality of magnets;
a shunt plate coupled to a top portion of each of the plurality of magnets; and
a lower plate coupled to a lower extremity of each of the plurality of magnets, wherein the lower extremities of each of the plurality of magnets are at different vertical displacements and abut the lower plate,
wherein the magnetic assembly is configured to rotate around an axis to generate an electromagnetic field that moves ions toward a target region within the chamber, and
wherein the vertical displacement of each of plurality of magnets is designed based on a target erosion profile;
a sensor for measuring the electromagnetic field of the magnetic assembly and for measuring a physical contour of a target disposed within the target region; and
a processor for determining the target erosion profile based on the measurements of the electromagnetic field and the measurements of the physical contour by the sensor,
wherein the measurements of the physical contour determines at least one of target depressions and target punctures for the magnetic assembly, the target and the chamber.

2. The system of claim 1, further comprising the target disposed within the target region, wherein the magnetic assembly is configured to rotate around the axis to generate the electromagnetic field with the ions that sputters the target.

3. The system of claim 2, wherein the electromagnetic field is configured to erode the target along an even gradient over time that avoids the target puncture.

4. The system of claim 2, wherein the electromagnetic field is configured to sputter the target without a peak or trough along a surface of the target.

5. The system of claim 2, wherein the plurality of magnets comprises an inner magnetic portion and an outer magnetic portion, and the inner magnetic portion and the outer magnetic portion are connected by the shunt plate.

6. The system of claim 5, wherein the plurality of magnets are disposed between the shunt plate and the lower plate.

7. The system of claim 1, wherein a first pair of the plurality of magnets are spaced by a first distance that is greater than a second distance between a second pair of the plurality of magnets.

8. A magnetic assembly for use in physical vapor deposition, the magnetic assembly comprising:
a plurality of magnets each having a different vertical displacement from another one of the plurality of magnets;
a shunt plate coupled to a top portion of each of the plurality of magnets; and
a lower plate coupled to a lower extremity of each of the plurality of magnets, wherein the lower extremities of each of the plurality of magnets are at different vertical displacements and abut the lower plate,
wherein the magnetic assembly is configured to rotate around an axis to generate an electromagnetic field, and
wherein the vertical displacement of each of plurality of magnets is designed based on a target erosion profile,
wherein a sensor measures the electromagnetic field of the magnetic assembly and measures a physical contour of a target disposed within a target region,
wherein a processor determines the target erosion profile based on the measurements of the electromagnetic field and the measurements of the physical contour by the sensor,
wherein the measurements of the physical contour determines at least one of target depressions and target punctures for the magnetic assembly, the target and a chamber.

9. The magnetic assembly of claim 8, wherein at least three magnets of the plurality of magnets has equivalent magnetic strength.

10. The magnetic assembly of claim 8, wherein at least three magnets of the plurality of magnets have different magnetic strengths.

11. The system of claim 8, wherein a first pair of the plurality of magnets are spaced by a first distance that is greater than a second distance between a second pair of the plurality of magnets.

12. The magnetic assembly of claim 8, wherein the shunt plate is configured to rotate around the axis.

13. The magnetic assembly of claim 8, wherein the axis is beyond the shunt plate.

14. The magnetic assembly of claim 8, wherein the electromagnetic field is configured to erode the target along an even gradient over time that avoids the target punctures.

15. The magnetic assembly of claim 8, wherein the electromagnetic field is configured to sputter the target without a peak or trough along a surface of the target.

16. A method, comprising:
   producing a magnetic field using a magnetic assembly contained within a chamber, the magnetic assembly comprising:
      a plurality of magnets each having a different vertical displacement from another one of the plurality of magnets;
      a shunt plate coupled to a top portion of each of the plurality of magnets; and
      a lower plate coupled to a lower extremity of each of the plurality of magnets, wherein the lower extremities of each of the plurality of magnets are at different vertical displacements and abut the lower plate,
   wherein the vertical displacement of each of plurality of magnets is designed based on a target erosion profile;
   sputtering a target disposed within the chamber using an electromagnetic field of ions controlled by the magnetic field;
   depositing a material sputtered from the target onto a wafer within the chamber;
   measuring, by a sensor, the electromagnetic field of the magnetic assembly and measuring a physical contour of the target disposed within a target region;
   determining, by a processor, the target erosion profile based on the measurements of the electromagnetic field and the measurements of the physical contour by the sensor; and
   determining at least one of target depressions and target punctures for the magnetic assembly, the target and the chamber based on the measurements of the physical contour.

17. The method of claim 16, comprising:
   spinning the magnetic assembly around an axis.

18. The method of claim 16, comprising:
   eroding the target along an even gradient over time that avoids target puncture.

19. The method of claim 16, wherein at least three magnets of the plurality of magnets have different magnetic strengths.

20. The system of claim 1, wherein the target erosion profile is periodically updated based on updated measurements of the electromagnetic field and updated measurements of the physical contour by the sensor.

* * * * *